United States Patent [19]

Braun

[11] Patent Number: 4,989,972
[45] Date of Patent: Feb. 5, 1991

[54] LOW REFLECTIVITY SURFACE RELIEF GRATINGS FOR PHOTODETECTORS

[75] Inventor: David M. Braun, Santa Rosa, Calif.

[73] Assignee: Hewlett-Packard Company, Palo Alto, Calif.

[21] Appl. No.: 346,182

[22] Filed: May 1, 1989

[51] Int. Cl.$^5$ .................... G01J 1/42; H01L 31/0232
[52] U.S. Cl. ..................... 356/225; 250/211 J; 350/162.2; 350/162.22; 357/30; 356/124
[58] Field of Search .................. 356/124, 218, 225; 357/30 L; 250/211 J; 350/162.17, 162.2, 162.21, 162.22, 96.19

[56] References Cited

FOREIGN PATENT DOCUMENTS 60-88482 5/1985 Japan .................................. 357/30 L

OTHER PUBLICATIONS

R. W. Tkach and A. R. Chraplyvy, "Linewidth Broadeninig and Mode Splitting Due to Weak Feedback in Single-Frequency 1.5 Micrometer Lasers," *Elect. Lett.* 21, 1081 (1985).

R. W. Tkach and A. R. Chraplyvy, "Regimes of Feedback Effects in 1.5-Micrometer Distributed Feedback Lasers," *J. Lightwave Technol.*, LT-4, 1655 (1986).

D. M. Braun, "Design of Single Layer Antireflection Coatings for InP/In$_{0.53}$Ga$_{0.47}$As/InP Photodetectors for the 1200–1600 nm Wavelength Range," *Appl. Opt.* 27, 2006 (1988).

M. G. Moharam and T. K. Gaylord, "Diffraction Analysis of Dielectric Surface-Relief Gratings," *J. Opt. Soc. Am.* 72, 1385 (1982).

T. K. Gaylord, W. E. Baird and M. G. Moharam, "Zero-Reflectivity High Spatial-Frequency Rectangular-Groove Dielectric Surface Relief Gratings," *Appl. Opt.* 25, 4562 (1986).

R. C. Enger and S. K. Case, "Optical Elements with Ultrahigh Spatial-Frequency Surface Corrugations," *Appl. Opt.* 22, 3220 (1983).

T. K. Gaylord and M. G. Moharam, "Analysis and Applications of Optical Diffraction by Gratings," *Pro. IEEE.* 73, 894 (1985).

*Primary Examiner*—F. L. Evans
*Attorney, Agent, or Firm*—William C. Milks, III

[57] ABSTRACT

Photodetectors having low reflectivity triangular groove, surface relief gratings on homogenous material or one layer of a heterostructure. Preferably, the photodetector is a PIN photodiode in which the p-type layer is triangularly grooved. The surface relief gratings have an optical repeat distance greater than the wavelength of light which impinges on the photodetector surface. Thus, zero order backward diffracted waves are not coupled into optical reflections which would thereby decrease the optical return loss (ORL). Furthermore, the surface relief gratings have minimum side-wall angles to limit reflection at the heterostructure interfaces from contributing to the ORL. The side-angles of the gratings are chosen to ensure that the angle of the higher order backward diffracted wave is greater than the capture angle of an optical receiver into which the photodetector is incorporated. The free-space depth of the grooves is a half-wavelength of the light impinging on the photodetector. Additionally, a novel ion milling technique is disclosed. This technique involves providing a rectangular groove grating initially etched by conventional chemical etching and photoresistive techniques and then ion milling at particular ion mill angles to obtain triangular groove surface relief gratings provided in accordance with this invention.

32 Claims, 4 Drawing Sheets

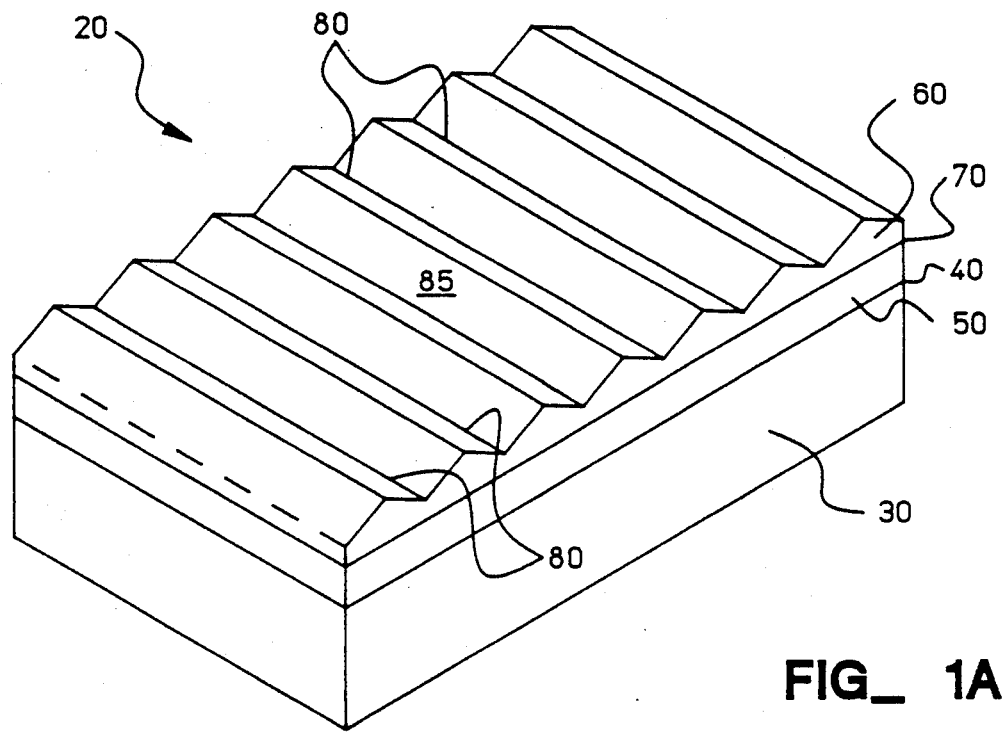
FIG_ 1A
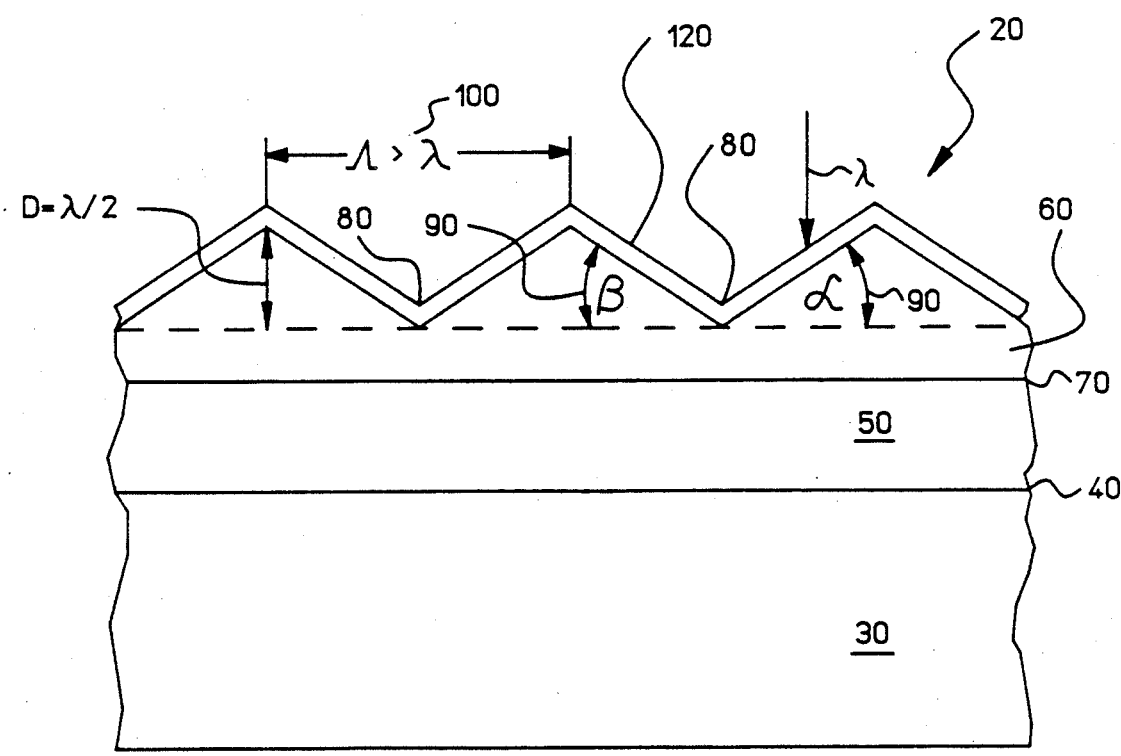
FIG_ 1B

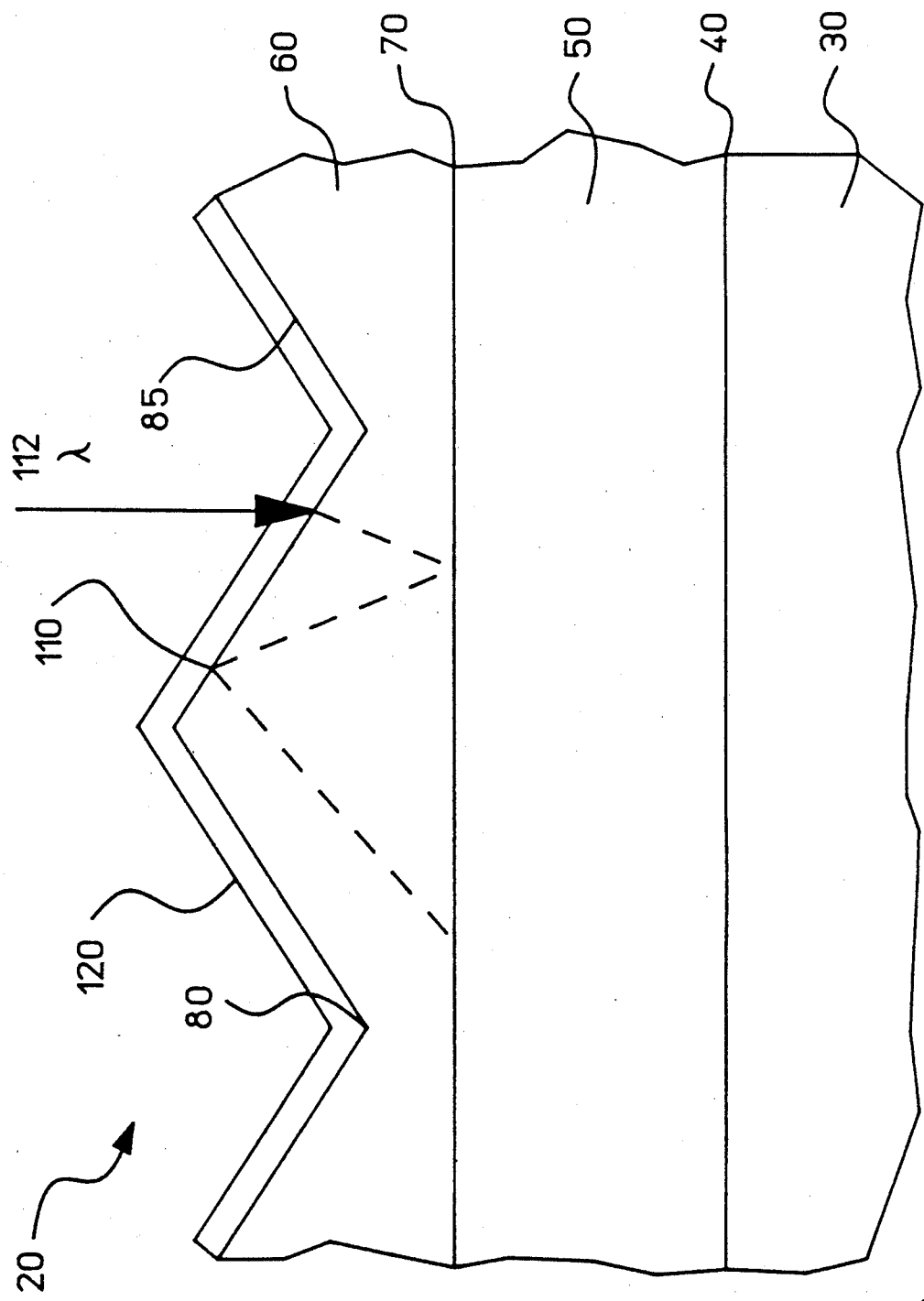
FIG_2

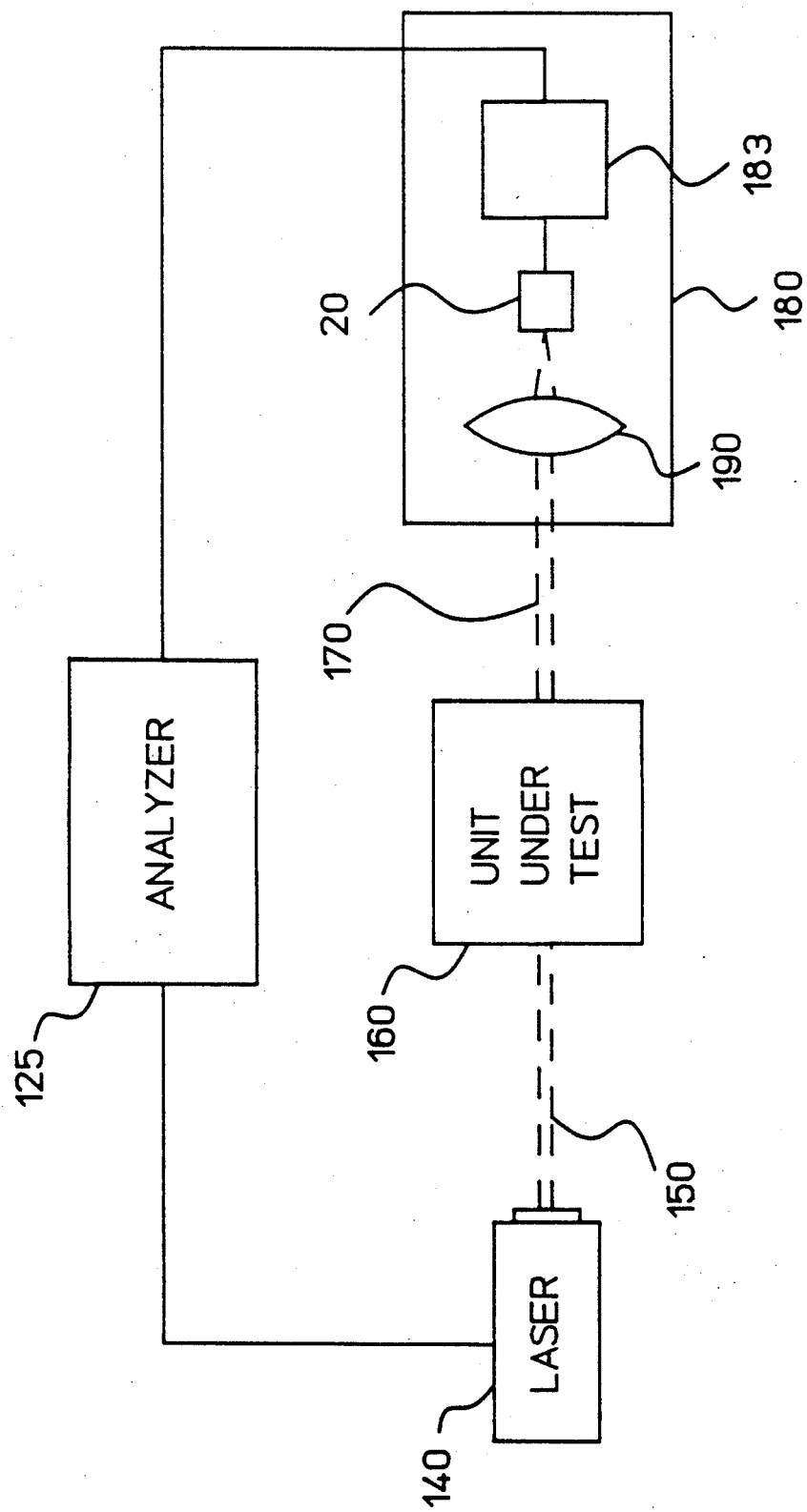
FIG_3

LOW REFLECTIVITY SURFACE RELIEF GRATINGS FOR PHOTODETECTORS

FIELD OF THE INVENTION

This invention relates generally to optical systems which utilize photodetectors. More particularly, this invention relates to triangular grooves formed on the surface of homogeneous material, or on the surface of one layer of a heterostructure comprised of different layers of materials having different refractive indices, to provide low reflectivity surfaces on photodetectors utilized in optoelectronic measurement systems.

BACKGROUND OF THE INVENTION

Optoelectronic measurement systems are useful for determining various optical properties of optical systems subsystems, components or samples under test. In general, light reflected from, transmitted through or generated by a unit under test (UUT) falls on a photodetecting device which then transduces the light into an electrical signal This electrical signal is then analyzed to obtain various optical parameters associated with the UUT Myriad types of analyses can be accomplished with these optoelectronic measurement systems to yield highly useful information about the UUT. In general, any type of light can be analyzed by optoelectronic measurement systems, for example, white light, monochromatic light, polarized light or unpolarized light.

Optoelectronic systems which make measurements of a UUT generally comprise optical receivers that focus light from the UUT onto a photodetector. One important optical receiver parameter is the "optical return loss" (ORL) defined as:

$$ORL = 10 \log (P_i/P_r);$$

where $P_r$ is the reflected optical power from the receiver and $P_i$ is the incident optical power to the receiver. The receiver ORL is thus a measure of the incident optical power to the receiver as compared to the reflected optical power from the receiver.

It is critical that the ORL be maximized. For example, reflection from the receiver must be minimized to avoid perturbing other sensitive elements of an optical system under test, such as a laser. Linewidth variations from an indium gallium arsenide phosphide (InGaAsP) distributed feedback laser have been observed for reflected optical feedback as low as 0.000001%. See R. W. Tkach and A. R. Chraplyvy, "Linewidth Broadening and Mode Splitting Due to Weak Feedback in Single Frequency 1.5 Micrometer Lasers," *Elect. Lett.* 21, 1081 (1985) and R. W. Tkach and A. R. Chraplyvy, "Regimes of Feedback Effects in 1.5 Micrometer Distributed Feedback Lasers," *J. Lightwave Technol.*, LT-4, 1655 (1986). Thus, even relatively minor reflections from the receiver can perturb sensitive optical elements. Great effort has been devoted in the art to increasing the receiver ORL in optoelectronic measurement systems to alleviate these problems.

A major cause of degraded receiver ORL occurs when light incident to the photodetector utilized in the receiver reflects within the numerical aperture of the optical focusing means. One approach to increasing the ORL in this situation is to coat the photodetector surface with an antireflection (AR) coating, thereby decreasing the level of reflected light from the photodetector. Single and multiple layer antireflection coatings have been used with homogeneous photodetector materials, such as silicon or germanium. For example, it is known that for a homogeneous material, a single antireflection coating having a refractive index equal to the geometric mean of the refractive index of the homogeneous material and the incident medium, and an optical thickness equal to a quarter wavelength of the incident light will cause the reflected optical power to be zero at the center wavelength.

However, for planar InP/InGaAs/InP PIN heterojunction material structures, the implementation of an antireflection coating is limited by the thickness accuracy of the organometallic vapor phase epitaxy grown InP and InGaAs layers. See, e.g., D. M. Braun, "Design of Single Layer Antireflection Coatings for InP/In$_{0.53}$Ga$_{0.47}$As/InP Photodetectors in the 1200-1600 nm Wavelength Range," *Appl. Opt.* 27, 2006 (1988). Antireflection coatings disclosed in this article experimentally achieved 0.49% reflected optical power at a wavelength of 1312 nm and 0.20% reflected optical power at a wavelength of 1515 nm. While AR coatings increase ORL, optoelectronic measurement systems with optical elements having high sensitivities cannot tolerate an ORL of this magnitude Thus, planar AR coated surfaces do not satisfy the need for maximizing the ORL of receivers employing heterostructure photodetectors in sensitive optoelectronic measurement systems.

Another approach to improving the ORL of optical receivers is the use of low reflectivity surface topographies. Known low reflectivity surface topographies in the form of grooves have typically been fabricated on homogeneous, uniform materials. Grooved surfaces of this nature, referred to as "surface relief gratings," are disclosed in M. G. Moharam and T. K. Gaylord, "Diffraction Analysis of Dielectric Surface Relief Gratings," *J. Opt. Soc. Am.* 72, 1385 (1982); Erratum 73, 411 (1983); T. K. Gaylord, W. E. Baird and M. G. Moharam "Zero Reflectivity High Spatial-Frequency Rectangular-Groove Dielectric Surface Relief Gratings," *Appl. Opt.* 25, 4562 (1986); R. C. Enger and S. K. Case, "Optical Elements with Ultrahigh SpatialFrequencies Surface Corrugations," *Appl. Opt.* 22, 3220 (1983). Furthermore, it is known that dielectric surface relief gratings exhibit good antireflective properties and very low diffracting efficiency in backward diffracted orders. See, e.g., T. K. Gaylord and M. G. Moharam, "Analysis and Applications of Optical Diffraction by Gratings," *Pro. IEEE.* 73, 894 (1985).

However, the surface relief gratings disclosed in the aforementioned articles require that the optical repeat distance of the grooves, Λ, be less than or equal to the wavelength of the incident light in free space, λ. Under this condition, the ORL generally improves with increased groove depth. The aforementioned Enger and Case article suggests that these high aspect ratio and high spatial frequency grooves act as a surface whose average index of refraction is smoothly tapered from that of air to that of the substrate material Therefore, in heterostructure photodetectors having different layer refractive indices and with the grooves formed in the top layer, the reflected power from the layer interfaces will efficiently couple to the zero order backward diffracted wave. These layer interface reflections can be significant. For example, the magnitude of reflection from a planar InP/InGaAs interface for normal incident light with a wavelength of 1300 nm is theoretically calculated to be about 0.4%. Thus, these designs efficiently couple the large interface reflection to the zero order backward diffracted wave and are not conducive to limiting the ORL in optical receivers employing heterostructure photodetectors used in optoelectronic measurement systems Deep grooves are also inappropriate for small area PIN photodetectors since a very thick p layer is required to accommodate the grooves. The growth time for the p layer will cause the p and n type dopants to diffuse into the i layer causing performance degradation. Therefore, known topographies with grooves having $\Lambda \leqq \lambda$ cannot efficiently increase receiver ORL in photodetectors to achieve low reflected power.

SUMMARY OF THE INVENTION

The inventor of the subject matter herein disclosed and claimed has discovered that low reflectivity triangular grooves in the form of surface relief gratings having $\Lambda > \lambda$, a free space groove depth equal to an integral half-wavelength and a layer thickness one to three times the groove depth achieve minimum reflections for normal incident light. Such surface relief gratings in heterostructures limit the contribution of interface reflections to the zero order backward diffracted wave. The triangular groove surface relief gratings are generally formed on photodetectors comprising PIN photodiodes. Triangular grooves formed on the surface of a photodetector in accordance with this invention also maintain a low level of the zero order backward diffracted wave for homogeneous material.

Since $\Lambda > \lambda$ for the surface relief gratings provided in accordance with the present invention, higher order backward diffracted waves will be present. Thus, in preferred embodiments an upper limit on $\Lambda$ is needed to maintain the angle of the first order backward diffracted wave outside the capture angle of the optical receiving means in the optoelectronic measurement system. Preferably, by choosing the groove depth equal to a half-wavelength of the incident light to the photodetector and the maximum $\Lambda$, the multiple side-wall reflections within the grooves themselves will be reduced, thereby reducing the ORL in optoelectronic measurement systems incorporating photodetectors provided in accordance with this invention. Photodetectors having triangular grooves with uniform depth surface gratings provided in accordance with this invention experience less than 0.035% reflected optical power.

Accordingly, one embodiment of the present invention provides triangular grooves formed on a surface to provide low reflectivity surface relief gratings for a receiver in an optoelectronic measurement system. In further embodiments, the low reflectivity gratings comprise a plurality of triangular grooves formed on a first layer, the grooves having a uniform repeat distance greater than the wavelength of the light incident on the first layer, a uniform depth substantially equal to an integral half-wavelength of the light detected by the first layer and a plurality of side-angles with respect to the first layer.

Additionally, methods provided in accordance with this invention make low reflectivity surface relief gratings in the form of triangular grooves on semiconductor materials. Preferably the grooves have a substantially uniform repeat distance. In one embodiment, rectangular grooves are formed on the semiconductor material surface by chemical etching. The semiconductor materials are then ion milled in a low pressure, ionizing plasma at a predetermined energy and current density. It is necessary to perform the ion milling step at two milling angles, and preferably for a time while the semiconductor material is elevated with respect to a material support platen to prevent the removed material from redepositing on the grooved surface.

BRIEF DESCRIPTION OF THE DRAWINGS

FIG. 1A is an isometric view of a photodetector provided in accordance with one embodiment of this invention having low reflectivity triangular groove surface relief gratings.

FIG. 1B is an end view of the triangular groove surface relief gratings of FIG. 1A.

FIG. 2 is an enlarged view of the triangular grooves of surface relief gratings provided in accordance with this invention showing reflection from an InP and InGaAs interface.

FIG. 3 is a block diagram of an optoelectronic measurement system utilizing a photodetector with triangular groove surface relief gratings provided in accordance with this invention.

DETAILED DESCRIPTION OF PREFERRED EMBODIMENTS

Figure 4A:
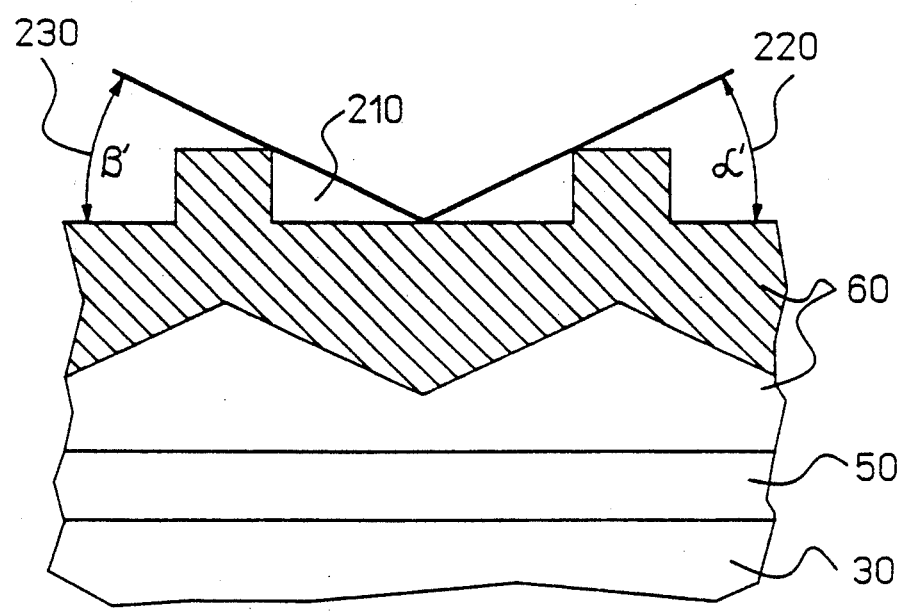
FIG. 4A is an enlarged end view of a rectangular groove surface etched with conventional etching and photoresistive techniques before novel ion milling processes provided in accordance with this invention are applied to the grating to obtain triangular grooves.

Referring now to the drawings wherein like reference numerals refer to like elements, FIG. 1A shows a heterostructure photodetector generally indicated at 20. Preferably, photodetector 20 is a PIN photodiode comprising three layers. A first layer 30 is a substrate or n-type layer. A second layer 50 is interfaced at 40 with substrate 30 and comprises an absorbing intrinsic or i layer. A third layer 60 is interfaced at 70 with a second layer 50 and comprises a p-type layer. Triangular grooves 80 are formed on a surface 85 of third layer 60.

In one embodiment, the first layer 30 is a substrate of semiconducting material, for example, indium phosphide (InP). For example, when the semiconductor substrate 30 comprises indium phosphide, the subtrate is an n+, silicon doped InP substrate which is preferably doped to an amount greater than $4 \times 10^{18}$ cm$^{-3}$. Second layer 50 is, for example, indium gallium arsenide (InGaAs). For example, when InGaAs is used as second layer 50, it is generally desired to have the InGaAs layer undoped, i.e., having doping levels less than $4 \times 10^{15}$ cm$^{-3}$. Finally, the third layer 60 generally comprises a semiconducting material, for example, InP, gallium arsenide, germanium or silicon, which in the embodiment shown is substantially thinner than layer 30. For example, when InP is used as third layer 60 it is generally desired to provide p+, zinc doped indium phosphide, doped to a level greater than $1 \times 10^{18}$ cm$^{-3}$. In accordance with this invention, a triangular groove diffraction grating is formed on the InP third layer 60 on surface 85 of the InP third layer opposite the InP/InGaAs interface 70.

Referring to FIG. 1B, triangular grooves 80 are formed on the InP third layer 60 and have side-angles 90. In general, side-angles 90 can have different values $\alpha$ and $\beta$. However, in one preferred embodiment $\alpha = \beta$. In one implementation, the side-angles 90 are about 20°.

Grooves 80 have a free-space depth, D, equal to an integral multiple of an optical half-wavelength, n λ/2, wherein λ is the wavelength of the light which falls on the photodetector and n is a positive integer. In one preferred embodiment, n=1. For incident light at λ=1300 nm, the power in the zero order backward diffracted wave is minimized at a groove depth of 650 nm (λ/2).

As shown in FIG. 1B, an antireflection coating 120, for example, silicon nitride, can be applied to grooves 80 to further reduce reflected power in the zero order backward diffracted wave. AR coating 120 is provided to further reduce reflected power from the zero order backward diffracted wave at wavelengths when the groove depth, D, is not equal to an integral half-wavelength. AR coatings of this nature are designed to minimize reflections of unpolarized light with wavelengths of about 1550 nm at normal incidence to photodetector 20.

Grooves 80 also have a uniform repeat distance, Λ, indicated generally at 100. As herein defined and used throughout, Λ is the peak to peak distance between each pair of adjacent grooves 80. Surface relief gratings provided in accordance with the present invention are fabricated so that Λ>λ.

Referring to FIG. 2, a portion of the incident light 112 transmitted by third layer 60 is reflected at interface 7 and then totally internally reflected at the triangularly grooved surface 85, as shown at 110. Internal reflection 110 greatly improves the ORL for heterojunction photodetectors in optoelectronic measurement systems having surface relief gratings provided in accordance with the present invention. For increasing Λ, a larger portion of the light reflected from interface 70 is totally internally reflected at 110. This is true in general until Λ is so large that the side-angles 90 are so small that the light reflected from interface 70 approaches surface 85 at near normal incidence and is no longer totally internally reflected.

Referring to FIG. 3, an exemplary optoelectronic system for measuring UUT 160 is shown. UUT 160 may be any type of sample which transmits light and which must be analyzed for a particular application. Photodetector 20 has low reflectivity antireflective triangular groove surface 85 wherein Λ>λ. Photodetector 20 is in communication with an analyzer means 125. Analyzer means 125 is a typical standard instrument, such as an HP 8702A manufactured by the Hewlett-Packard Company, which compares the received electrical signal from photodetector 20 with the electrical signal sent to a light source 140 which may be a monochromatic light source, for example, a laser, to determine the UUT's optical parameters.

Light 150 from light source 140 falls on UUT 160. Light 150 may be unpolarized or polarized as is desired for the particular measurement.

Light 170 is transmitted through UUT 160 and is directed to optical receiving means 180. Optical receiving means 180 is operatively coupled to analyzer means 125. Optical receiving means 180 can comprise objective lens 190 which functions to focus transmitted light 170 onto photodetector 20. Objective lens 190 has a specific numerical aperture (NA).

Photodetector 20 has a low reflectivity surface provided in accordance with this invention so that the ORL of photodetector 20 approaches the order of 0.035%. In one preferred embodiment, optical receiver means 180 comprises objective lens 190 and can further comprise photodetector 20 as a single component in the optoelectronic measurement system. Optical receiving means 180 can further comprise an amplifier 183.

Because the repeat distance of the triangular grooves formed on photodetector 20 is greater than the wavelength of the light from light source 140, higher order backward diffracted waves will exist in optical receiving means 180. The inventor has determined that to prevent higher order backward diffracted waves from interfering with objective lens 190, the angle of the first order wave must be greater than the capture angle of the objective lens 190 for rays that are incident at up to the capture angle of the objective lens. This requires that:

$$\alpha > \tan^{-1}(2NA),$$

for the case when $\alpha = \beta$ and D is an optical half-wavelength.

For example, for an objective lens 190 numerical aperture of 0.18, α must be greater than 19.8 degrees. Therefore, higher order backward diffracted waves will not interfere with objective lens 190 and thus do not decrease the ORL of optical receiving means 180.

In accordance with this invention, the free-space groove depth of the triangular groove grating is chosen to be equal to an optical half-wavelength. With λ=1300 nm, a metric groove depth D=650 nm will minimize the power in the zero order backward diffracted wave. Therefore, surface relief grating designs provided in accordance with this invention maximize ORL for high speed optical receiving means 180 with normal incident light on photodetector 20. When λ is not equal to 1300 nm and thus the groove depth is not an integral half-wavelength, AR coating 120 reduces the power in the reflected zero order backward diffracted wave. Photodetectors provided in accordance with this invention can generally achieve ORL less than about 0.035%.

The present invention also provides methods of making triangular groove, low reflectivity surface relief gratings. In order to produce PIN photodetectors on semiconducting materials having low reflectivity, triangular groove surfaces, it is generally desired to first grow epitaxial layers by organometallic vapor phase epitaxy (OMVPE) on n+, silicon doped InP substrates whose surfaces are oriented about 3° off the (100) plane towards the (110) plane. After growing a 100 nm thick undoped InP buffer layer, an undoped, lattice matched InGaAs absorbing layer about 1800 nm thick is grown on the InP substrate. Additionally, a p+, zinc doped InP layer of between 1750 nm and 3500 nm thick is grown on top of the InGaAs absorbing layer. In one preferred embodiment, the InP layer is 2100 nm thick.

In order to make triangular grooves, having side-angles of about 20°, a novel ion mill technique is applied to the semiconducting layers. In addition to producing symmetric, triangular grooves, this novel ion milling technique can also fabricate asymmetric, triangular grooves. It is generally desired to start the InP top layer at a thickness of greater than or equal to 1750 nm since the novel techniques provided in accordance with this invention require about 1100 nm of InP to be removed during the process while leaving about 650 nm (λ/2 of incident light).

In general, any type of conventional photoresistive and chemical etching technique can first be employed to obtain a rectangular grating surface on the indium phosphide layer. In one preferred embodiment, the chemical etching, photoresistive step consists of depositing about 50 nm of silicon nitride on the InP layer and using a photoresistive procedure to form about 0.75 micrometer wide photoresist lines in the (011) direction. A reactive ion etching step then etches field lines in the silicon nitride. $CF_4$ can be used to accomplish the reactive ion etching step. It is then generally desired to remove the photoresist with an oxygen plasma and then wet chemical etch the field InP to a depth of about 750 nm in a 1:1 solution by volume of $HCL/CH_3COOH$. After removing the silicon nitride in a 5:1 solution by volume of $NH_4F/HF$, the InP surface generally has rectangular grooves.

Referring to FIG. 4A, the rectangular grooves obtained from the aforementioned conventional photoresistive, chemical etching technique are shown. An InP layer 60 about 700 nm thick has rectangular grooves 210 etched thereon. After the conventional chemical etching technique is performed to produce rectangular grooves 210, the novel ion milling step provided in accordance with the present invention is applied to obtain a triangularly grooved surface with minimum side-angles. The novel ion milling technique is performed at milling angles $\alpha'$ and $\beta'$, indicated generally at 220 and 230, respectively. Angles $\alpha'$ and $\beta'$, are preferably in a range of about 15° to 45°, and more preferably in a range of about 25° to 35° with respect to surface 210. For triangular groove formation, the inventor has determined that the optimum grating period in nm is:

$$\Lambda = 750 + 700(\operatorname{ctn} \alpha' + \operatorname{ctn} \beta').$$

In one preferred embodiment, the ion milling parameters are $E=500$ eV, $J=0.45$ mA/cm$^2$, $P=1.5\times10^{-4}$ Torr, and the plasma is comprised of a 70% argon (Ar) and 30% oxygen ($O_2$) mixture.

Figure 4B:
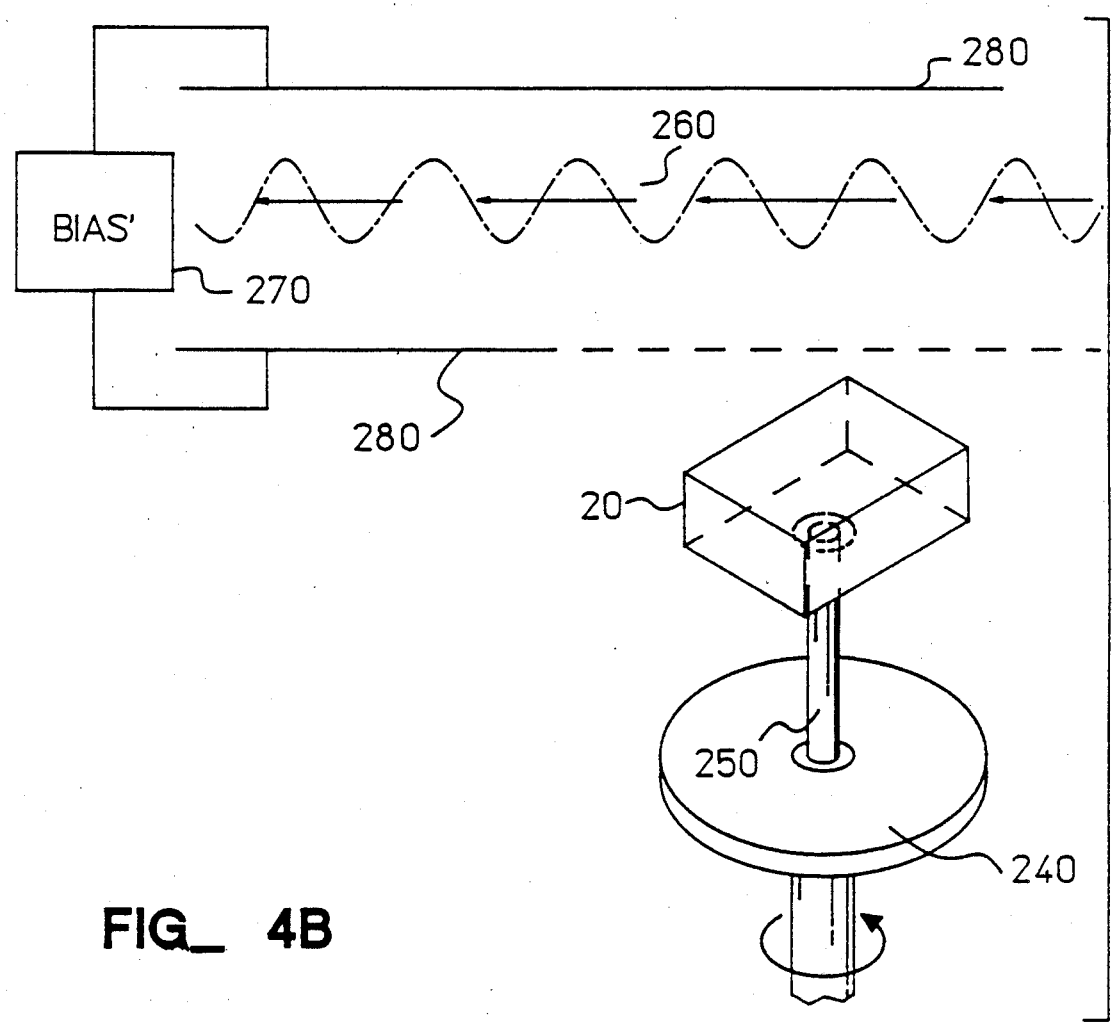
FIG. 4B is an illustration of novel ion milling processes provided in accordance with this invention to produce triangular groove surface relief gratinqs.

Referring to FIG. 4B, the ion milling step is illustrated. To prevent removed atoms from redepositing on the surface causing surface microfeatures to form, photodetector 20 is held elevated above a platen 240. In one preferred embodiment, photodetector 20 is held less than about 10 cm above platen 240 at the desired ion incident angles $\alpha'$ and $\beta'$. In another preferred embodiment, photodetector 20 is held about 2 cm above platen 240 at the desired ion incident angles. Photodetector 20 is held elevated in this manner by photodetector holder 250.

Platen 240 is then rotated below the plasma $Ar/O_2$ field 260 as a DC bias is applied about the plasma by biasing means 270. Ion milling takes place as the argon and oxygen ions are accelerated through the biasing grid 280 and directed at photodetector 20. Biasing initiates ion milling of the indium and phosphorus atoms from the InP rectangular grooved layer. It is generally desired to offset photodetector holder 250 from the center of platen 240 with photodetector 20 facing opposite the direction of rotation of the platen.

During the ion milling step the photodetector 20 is tilted alternately so that milling first takes place at angle $\alpha'$ and then at angle $\beta'$. It is preferred that ion milling at $\alpha'$ and $\beta'$ take place in three minute increments for a total time of approximately thirty minutes. After the ion milling step is completed, the resulting surface profile is a triangular groove surface relief grating having side-angles $\alpha$ and $\beta$ approximately 10° less than the ion mill angles $\alpha'$ and $\beta'$ and even more preferably about 5° less than $\alpha'$ and $\beta'$. Furthermore, the final metric thickness of the InP top layer is about 1100 nm less than the starting thickness.

An AR coating 120 of silicon nitride can then be deposited on the triangular grooves by plasma enhanced, chemical vapor deposition techniques. Depending upon the desired resulting side-angles to be achieved with the methods herein disclosed, the AR coatings have refractive indices of about 1.83 for silicon nitride and thicknesses varying from about 200 nm to about 230 nm, most preferably about 210 nm.

Triangular groove, surface relief gratings for photodetectors fabricated on InP top layers of InP/InGaAs/InP epitaxial structures by ion milling techniques provided in accordance with this invention produce photodetectors having less than about 0.035% reflected optical power measured using monochromatic, unpolarized light of $\lambda=1300$ nm. The receiver ORL is minimized when the free-space groove depth of the triangular groove surface relief gratings is about an integral half-wavelength of the incident light. When minimum side-angles $\alpha=\beta\approx20°$ are formed, the application of an AR silicon nitride coating effectively lowers the ORL for wavelengths of incident light where the grating depth is not equal to an integral half-wavelength. Antireflection coatings applied to grooves 80 aid in achieving similar results when the depth of the grooves is not equal to an integral half-wavelength of the monochromatic light.

Thus, optoelectronic measurement systems which utilize high speed optical receiver means with objective lenses having numerical apertures of about 0.18 have maximized ORL when photodetectors having triangular groove, surface relief gratings provided in accordance with this invention are utilized. Therefore, triangular groove, surface relief gratings and the methods of making these gratings satisfy long-felt needs in the art for photodetectors having low reflectivity surfaces to provide ORL of about 0.035% in optoelectronic measurement systems.

While described embodiments of photodetectors having surface relief gratings provided in accordance with this invention are constructed on heterogeneous PIN photodiodes, homogeneous photodetectors having gratings with $\Lambda>\lambda$ and $D=\lambda/2$ would also maximize ORL in optical receivers. Furthermore, although exemplary materials and doping levels are described for one implementation of a PIN photodetector in accordance with the invention, materials and doping levels can be different for other implementations utilized in other applications having different PIN photodetector electrical conductivity requirements. Also, while PIN photodetectors are described, NIP photodetectors are also contemplated with triangular grooves formed on the surface of the n-type layer in accordance with this invention.

There have thus been described certain preferred embodiments of low reflectivity, triangular groove surface relief gratings for photodetectors. Additionally, methods of making these gratings have been disclosed. While preferred embodiments have been described and disclosed, it will be recognized by those with skill in the art that modifications are within the true spirit and scope of the invention. The following appended claims are intended to cover all such modifications.

What is claimed is:

1. A low reflectivity surface relief grating incorporated into optical receiving means responsive to incident light having a given wavelength useful, by way of example, in an optical measurement system, comprising:

a plurality of triangular grooves formed on a surface of a layer of material, the grooves having a uniform repeat optical distance greater than the wavelength of the incident light, a uniform free-space depth substantially equal to an integral multiple of a half-wavelength of incident light and a plurality of side-angles with respect to the surface on which the grooves are formed.

2. The grating recited in claim 1 wherein the plurality of side-angles are substantially equal to each other.

3. The grating recited in claim 2 wherein the sidean-gles are approximately twenty degrees.

4. The grating recited in claim 3 wherein the material consists of a homogeneous semiconducting material for detecting the incident light.

5. The grating recited in claim 4 wherein the semiconducting material is selected from the group of semiconducting materials consisting of indium phosphide, gallium arsenide, germanium and silicon.

6. The grating recited in claim 1 wherein the optical repeat distance is in the range of one to four wavelengths.

7. The grating recited in claim 1 wherein the freespace depth of the triangular grooves is one-half wavelength.

8. The grating recited in claim 1 wherein the material consists of a semiconducting material, and further comprising:
a second semiconducting layer interfaced with the layer of material on a side opposite to the triangular grooves; and
a semiconducting substrate interfaced with the second semiconducting layer on a side opposite to the interface of the layer of material and the second semiconducting layer.

9. The grating recited in claim 8 wherein the semiconducting substrate consists of indium phosphide.

10. The grating recited in claim 9 wherein the second semiconducting layer consists of indium gallium arsenide.

11. The grating recited in claim 10 wherein the layer of material consists of indium phosphide.

12. The grating recited in claim 1 further comprising an antireflection coating applied to the triangular grooves.

13. The grating recited in claim 12 wherein the antireflection coating consists of silicon nitride having a refractive index of approximately 1.83.

14. The grating recited in claim 1 wherein the plurality of side-angles are minimum side-angles.

15. The grating recited in claim 14 wherein the minimum side-angles are approximately 19.8°.

16. The grating recited in claim 12 wherein the reflected optical power in the zero order backward diffracted wave is less than 0.035%.

17. An optical receiver adapted to detect incident light having a given wavelength useful, by way of example, in an optoelectronic measurement system comprising:
photodetector means comprising a surface having a plurality of triangular grooves formed thereon, the grooves having a uniform free-space depth substantially equal to about half the wavelength of the incident light, a uniform repeat optical distance greater than the wavelength of the incident light and a plurality of side-angles.

18. The receiver recited in claim 17 wherein the sideangles are minimum side angles.

19. The receiver recited in claim 18 wherein the minimum side-angles are equal.

20. The optical receiver recited in claim 17, further comprising:
an objective lens having a numerical aperture for transmitting incident light;
the photodetector means being in optical communication with the objective lens for detecting light transmitted by the objective lens.

21. The receiver recited in claim 20 wherein a given capture angle of the numerical aperture is less than a given reflection angle of first order backward diffracted waves from the triangular grooves.

22. The receiver recited in claim 21 wherein the numerical aperture of the objective lens is less than 0.18 and the side-angles are greater than approximately 19.8°.

23. The receiver recited in claim 17 wherein the photodetector means further comprises an antireflection coating applied to the grooves for minimizing reflection of the incident light.

24. The receiver recited in claim 23 wherein the antireflection coating consists of silicon nitride having a refractive index of approximately 1.83.

25. The receiver recited in claim 17 wherein the photodetector means further comprises:
a semiconducting substrate;
an absorbing layer interfaced with the substrate, the substrate being interfaced with a first side of the absorbing layer; and
a semiconducting layer interfaced with a second side of the absorbing layer opposite to the first side of the absorbing layer interfaced with the substrate, the semiconducting layer having the triangular grooves integrally formed on a side opposite to the side interfaced with the absorbing layer.

26. The receiver recited in claim 25 wherein the semiconducting substrate consists of indium phosphide.

27. The receiver recited in claim 26 wherein the absorbing layer consists of indium gallium arsenide.

28. The receiver recited in claim 27 wherein the semiconducting layer consists of indium phosphide.

29. A method of determining optical parameters of a unit under test with an optoelectronic measurement system comprising the steps of:
focusing light received from the unit under test onto photodetector means comprising a low reflectivity surface relief grating, the grating having a plurality of triangular grooves formed thereon, the grooves having a uniform free-space depth substantially equal to approximately half the wavelength of the light, a uniform optical repeat distance greater than the wavelength of the light and at least two side-angles; and
analyzing the light focused on the photodetector to determine the optical parameters of the unit under test.

30. The method recited in claim 29 wherein the triangular grooves have minimum side-angles for reducing reflected optical power.

31. The method recited in claim 30 wherein the focused light is reflected from the triangular grooves having minimum side-angles that are substantially equal.

32. The method recited in claim 31 wherein the triangular grooves have minimum side-angles that are greater than approximately 19.8°.

* * * * *